United States Patent [19]

Frogge

[11] Patent Number: 4,933,648
[45] Date of Patent: Jun. 12, 1990

[54] CURRENT MIRROR EMPLOYING CONTROLLED BYPASS CIRCUIT

[75] Inventor: Perry W. Frogge, Palm Bay, Fla.
[73] Assignee: Harris Corporation, Melbourne, Fla.
[21] Appl. No.: 336,787
[22] Filed: Apr. 13, 1989
[51] Int. Cl.$^5$ ...................... H03F 3/04; H03K 19/092
[52] U.S. Cl. ..................................... 330/288; 307/475
[58] Field of Search .............................. 307/451, 475; 323/315–317; 330/288

[56] References Cited

U.S. PATENT DOCUMENTS

| 4,352,057 | 9/1982 | Okada et al. | 323/315 |
| 4,825,099 | 4/1989 | Barton | 330/288 X |

FOREIGN PATENT DOCUMENTS

| 177009 | 8/1986 | Japan | 330/288 |

Primary Examiner—James B. Mullins
Attorney, Agent, or Firm—Charles E. Wands

[57] ABSTRACT

An enhanced current mirror circuit includes an auxiliary (by-pass) transducer that is effectively coupled in parallel with the current regulation transistor and the gate voltage of which is controlled by a (doped polysilicon) resistor voltage divider. The components of the voltage divider are configured to compensate for a reduction in the size of the principal current control resistor in the current regulation path of the mirror. The auxiliary current (bypass) control circuit effectively compensates for variations in parameters of the components of the current mirror circuit by controllably regulating (bypassing) current that would otherwise flow through the mirror's current control transistor. The voltage divider network is preferably comprised of a plurality of polysilicon resistor elements the configuration of one of which corresponds to the configuration of the principal current control resistor element. The width of another of the resistor elements of the voltage divider network is relatively large. As a result of these resistance parameters, output signal levels are essentially unaffected by material and dimensional changes. Also, the channel length of the bypass control transistor is shorter than that of the current control transistor in order to enhance its sensitivity to manufacturing and operational changes.

26 Claims, 2 Drawing Sheets

"ENHANCED N-CHANNEL CURRENT MIRROR"

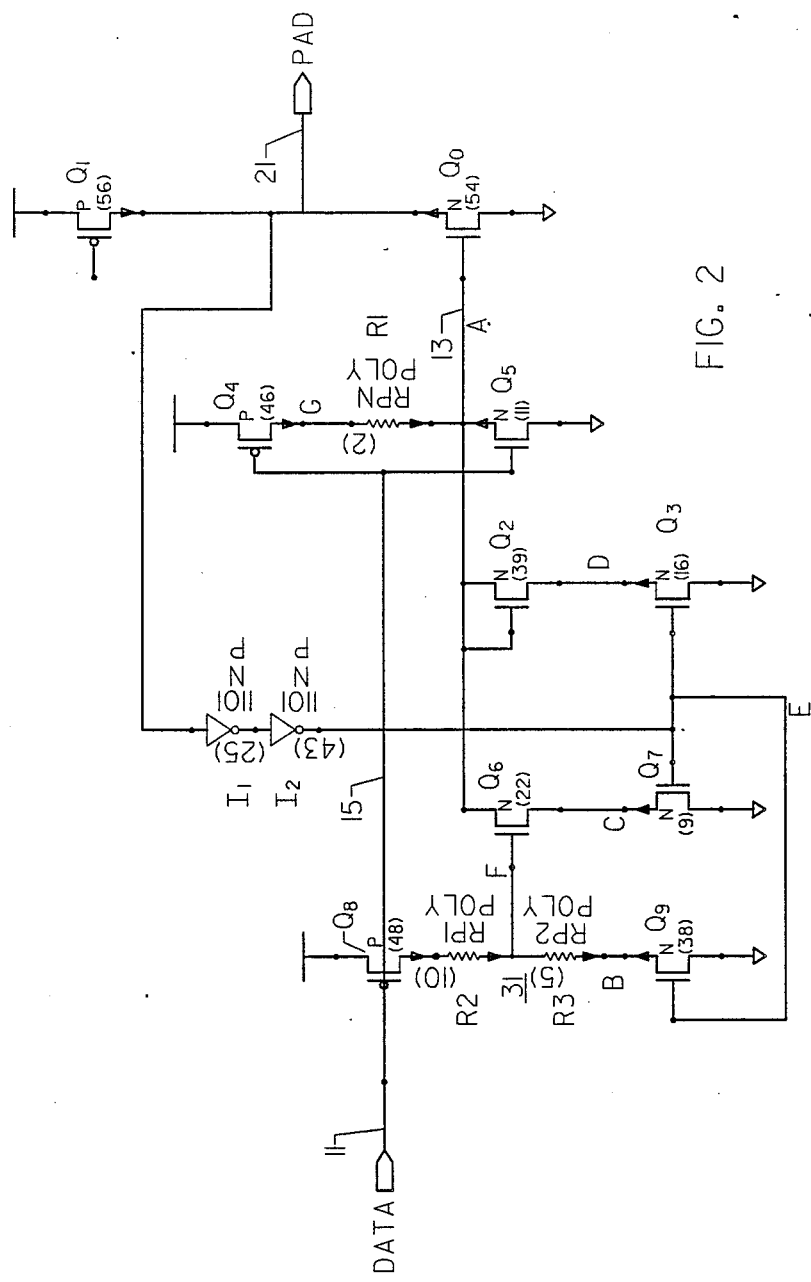
FIG. 2 "ENHANCED N-CHANNEL CURRENT MIRROR"

CURRENT MIRROR EMPLOYING CONTROLLED BYPASS CIRCUIT

FIELD OF THE INVENTION:

The present invention relates in general to digital control circuits an is particularly directed to an improved CMOS current mirror circuit such as one that may be incorporated in a digital output buffer.

BACKGROUND OF THE INVENTION:

Current mirror circuits are employed in a variety of applications, such as digital output driver/buffer circuits where a well defined or regulated current drive capability is required. One example of a digital (CMOS) output buffer where a current mirror is used to establish the current drive at the buffer output is described in the U.S. Pat. application to W.R. Young et al, Ser. No. 075,641, filed July 20, 1987, entitled "Controlled Switching CMOS Output Buffer" and now Pat. No. 4,818,901, and assigned to the assignee of the present application. In accordance with the configuration and operation of the buffer described in the Young et al application, an output driver transistor is controllably switched between first and second logic states (ON and OFF), such that when switched from its OFF state to its ON state, it operates in a constant current mode and serves to discharge the capacitance of its output load. When switched from its ON to its OFF state, the output transistor operates in a constant voltage mode. Because the output transistor is part of a current mirror circuit, its performance is dictated by its relationship to its associated mirror transistor.

More particularly, with reference to FIG. 1, the configuration of such a current mirror circuit is shown as including an output MOSFET Q0, the source of which is coupled to a first reference potential terminal (ground), the drain of which is coupled to an output terminal V0 and, via a diode-connected complementary transistor Q1, to a (high) reference potential terminal (+V). The gate of output transistor Q0 is coupled to the gate and source of a transistor Q2 and a current control regulating resistor element R1. The drain of transistor Q2 is coupled to the source of a transistor Q3, the drain of which is grounded and the gate of which is coupled to output terminal V0. Transistor Q3 is controllably gated ON and OFF to limit (interrupt) current flow during quiescent conditions. Resistor R1 is coupled to complementary transistors Q4 and Q5, the drain source paths of which are coupled in series between the high reference (+V) and ground, and the gates of which are coupled to an input terminal VIN.

The operation of the current mirror is such that current flow through output transistor Q0 is some predefined multiple of the current through transistor Q2, when each of transistors Q4, Q2 and Q3 is gated ON. In addition, resistor R1 is typically formed of a doped polysilicon line, the geometry of which is selected so that the current flow through transistors Q4, Q2 and Q3 is dictated by the magnitude of resistor Rl, rather than by the characteristics of the transistors in the serial circuit path.

When the output buffer of FIG. 1 is employed as part of a data processing system, it can be expected to encounter substantial output switching noise, commonly referred to as 'ground bounce', resulting from the sudden flow of current through the chip ground line when the buffer output is switched from a high to a low state. Depending upon the parameters of the buffer circuitry (as a consequence of wafer processing, temperature and power supply voltage) the magnitude of the ground bounce may be large enough to disrupt or interfere with device operations. As the demand for increasingly larger current switching capabilities (narrower current switching windows) are placed upon digital circuit designs, while still meeting limited area layout (semiconductor real estate) requirements, it can be seen that some mechanism must be provided for enabling the output transistor to switch larger currents without substantially increasing the occupation area or size of that particular component to achieve an enhanced current mirror function.

One possibility would be to merely reduce the magnitude of resistor R1, thereby increasing the current flow through transistor Q2 and thus causing a proportionally larger current to be mirrored in output transistor Q0. However, by only decreasing the magnitude of resistor R1, the current flow through components Q4, Q2 and Q3 is no longer predominantly controlled by the value of resistor R1, but becomes subject to variations in characteristics of the transistors, which are process and temperature dependent, so that the action of the current mirror will be influenced by such parameters in addition to the ratio of the channel widths of transistors Q0 and Q2.

SUMMARY OF THE INVENTION:

In accordance with the present invention, in addition to reducing the size of resistor R1, in order to increase the current flow to transistor Q2 and thereby maintain transistor Q0 to a reasonable size, the mirror current regulation performed by transistor Q2 is augmented by an auxiliary mirror transistor that is effectively coupled in parallel with the current regulation transistor and the gate voltage of which is controlled by a (doped polysilicon) resistor voltage divider, the geometry of which is configured to compensate for the reduction in the size of resistor R1.

More particularly, pursuant to the present invention, achieving a stable increase in the flow of current applied to transistor Q2 (which is mirrored through output transistor Q0), without altering the size of output transistor Q2, is accomplished by reducing the magnitude of resistor R1 and incorporating an auxiliary current (bypass) control circuit which effectively compensates for variations in parameters of the components of the current mirror circuit by controllably regulating (by-passing) current that would otherwise flow through transistor Q2. The voltage divider network is preferably comprised of a plurality of polysilicon resistor elements the configuration of one of which corresponds to the configuration of the reduced magnitude resistor R1. The width of another of the resistor elements of the voltage divider network is relatively large. As a result of these resistance parameters, output signal levels are effectively unaffected by material and dimensional changes. Also, the channel length of the bypass control transistor is shorter than that of the current control transistor Q2 in order to enhance its sensitivity to manufacturing and operational changes. An additional CMOS input transistor is coupled in the circuit path of the voltage divider network for further adjusting the voltage level applied to the gate of the bypass control transistor.

BRIEF DESCRIPTION OF THE DRAWINGS:

FIG. 2 is a schematic illustration of an enhanced current mirror circuit in accordance with an embodiment of the present invention.

Figure 1:
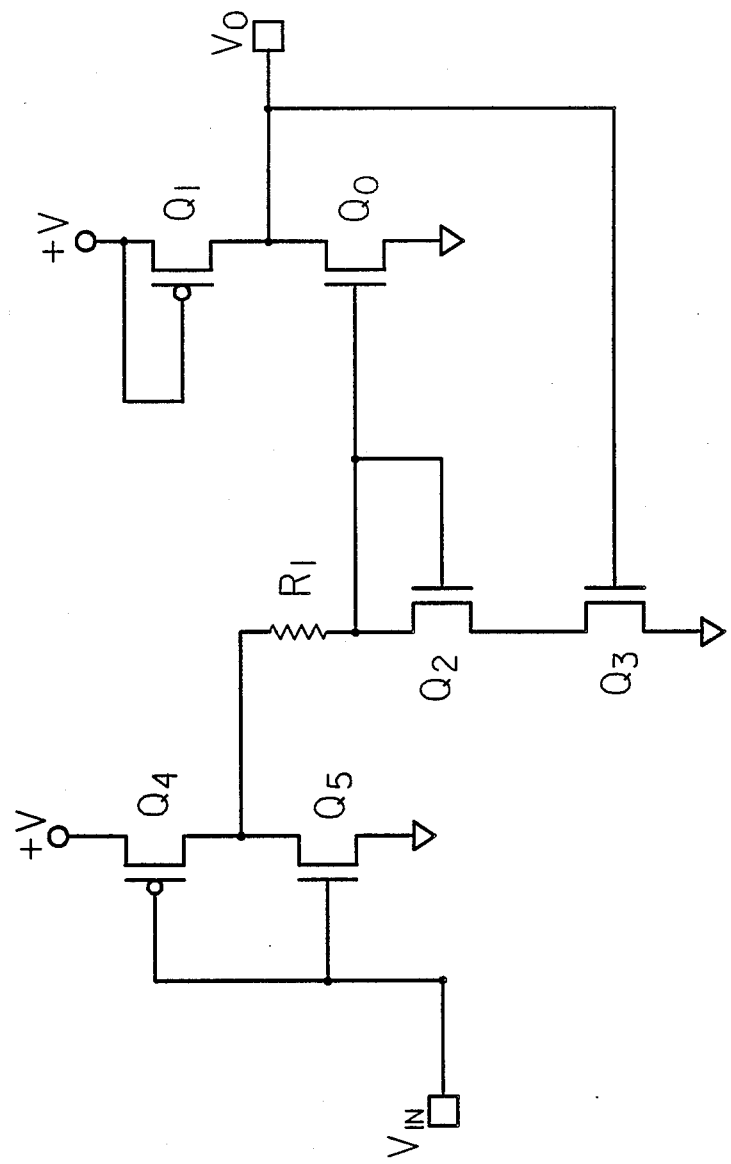
FIG. 1 diagrammatically shows the configuration of a current mirror circuit employed in the controlled CMOS output buffer described in the above-reference Young et al application.

DETAILED DESCRIPTION:

Referring now to FIG. 2, a preferred embodiment of an enhanced current mirror circuit in accordance with the present invention is shown as comprising an input terminal 11 to which an input signal (digital data signal) is applied, and an output terminal 21 from which a corresponding buffered digital output signal is derived. The load (e.g. bus) to which output terminal 21 is adapted to be coupled can expected to have substantial capacitance, which must be rapidly discharged by the operation of an N-channel output MOSFET Q0, the source-drain path of which is coupled between terminal 21 and a ground reference potential terminal. Output terminal 21 is further coupled through a P-channel MOSFET Q1 to a high voltage (+V) reference potential terminal and through cascaded inverters I1 and I2 to the gates of N-channel MOSFETs Q3, Q7 and Q9, the sources of which are grounded and which serve to controllably interrupt current flow through the circuit during quiescent conditions. Inverters I1 and I2 provide a delay sufficient to assure that output terminal 21 has completely switched before MOSFETs Q3, Q7 and Q9 are turned OFF.

Like the circuit configuration of FIG. 1, MOSFET Q0 mirrors the current through a current mirror control transistor Q2, the gate and source of which are connected in common, via link 13, to the gate of output transistor Q0. Also, input terminal 11 is coupled over link 15 to the respective gates of a P-channel MOSFET Q4 and an N-channel MOSFET Q5, the source-drain paths of which are coupled in series with a first resistor R1 between the high voltage reference terminal (+V) and ground. As mentioned previously, resistor R1 is typically formed of a (long and narrow) doped polysilicon line and normally has a much larger resistance value than the resistance values that are attributable to components Q4, Q2 and Q3 through which current flows during operation of the current mirror.

As discussed briefly above, in accordance with the present invention, the ability of the current mirror to drive more output current is enhanced by reducing the magnitude of resistor R1, so as to increase the magnitude of the current applied to control transistor Q2, which is proportionately mirrored as a larger output current in transistor Q0. By so reducing the magnitude of resistor R1, however, the magnitude of the control current becomes substantially influenced by the characteristics of the active components in the mirror circuit. Such characteristics can be expected to vary from device to device (due to manufacturing process variations) and as a result of different operating conditions. Pursuant to the invention, compensation for such variations is achieved by means of a (by-pass) mirror transistor (N-channel MOSFET) Q6, the source of which is coupled to link 13, the drain of which is controllably grounded through switched MOSFET Q7, and the gate of which follows the digital input signal at input terminal 11 by means of a voltage divider network 31 and a P-channel input MOSFET Q8.

Specifically, the source-drain path of MOSFET Q6 is effectively coupled in parallel with the current mirror control transistor Q2, so as to provide a by-pass path for 'shunting' current around transistor Q2, thereby controllably regulating the operation of the current mirror. Control of the by-pass function of transistor Q6 is accomplished by making its gate voltage sensitive to operational and process-defined parameters. To this end, the gate of transistor Q6 is coupled to a (doped polysilicon) resistor voltage divider network 31, the geometry of which is configured to compensate for the reduction in the size (polysilicon ine) of resistor R1. The voltage divider network 31 is preferably comprised of polysilicon resistor elements R2 and R3 coupled in series between the drain of P-channel MOSFET Q8, the source of which is coupled to a high (+V) terminal, and the drain of N-channel MOSFET Q9, the source of which is grounded.

Within voltage divider network 31, resistor element R3 is shaped like resistor element R1 as a long and thin layer of polysilicon, similar to a MOSFET gate, so that, if the manufacturing process through which a particular chip is fabricated yields a narrower width polysilicon layer, there will be a corresponding increase in resistance and the voltage drop across resistor element R3 will increase. Similarly, since resistor element R1 is configured like resistor R3, its narrower line width (associated with a reduction in device channel lengths) will reduce the current flow through MOSFET Q2. On the other hand, the width of that portion of the polysilicon layer through which resistor element R2 is formed is considerably wider than resistor element R3, so that resistor element R2 is relatively insensitive to changes in process variations which alter the dimensions of the polysilicon. As a consequence, the voltage dividing action of resistor network 31 will apply a more positive voltage to the gate of by-pass control MOSFET Q6, thereby turning on transistor Q6 harder and diverting or by-passing current away from MOSFET Q2. It should also be noted that since resistor elements R2 and R3 are formed of the same (polysilicon) material, any change in its sheet resistance will not change the voltage divider resistance ratio.

A further compensating aspect of the voltage divider control of by-pass MOSFET Q6 is the fact that the voltage differential is coupled to the high voltage reference terminal (+V) (through MOSFET Q8), so that an increase in power supply voltage will, in turn, raise the gate voltage of MOSFET Q6, thus diverting more current around MOSFET Q2. Preferably MOSFET Q8 is sized such that as its ON-resistance decreases (for example, either due to a temperature decrease or a higher processing drive-in temperature), the voltage at the gate of MOSFET Q6 will shift toward +V, thus driving MOSFET Q6 harder. Also, since each of MOSFETs Q0, Q2 and Q6 is of the same channel conductivity type (N-type), its ON-resistance will decrease the same (for the reasons discussed above with respect to transistor Q8), thereby causing more current to be shunted away from transistor Q2.

In operation, when DATA input terminal 11 is a logical '1' (high), MOSFET Q2 is ON, output MOSFET Q0 is OFF and through MOSFET Q5, output terminal 21 is pulled high (+V). In response to a high-to-low transition on DATA input terminal 11, each of P-channel MOSFETs Q4 and Q8 turns ON, thereby establishing two independent DC current paths between (+V) and ground: 1) through the voltage divider network 31, and 2) through resistor element R1. Line 13 rises to an intermediate voltage level as the current mirror drives output terminal 21, with MOSFET Q0 pulling output terminal 21 low. The voltage applied to the gates of each of MOSFETs Q3, Q7 and Q9 follows the output voltage (but delayed by inverters I1 and I2), which turns these transistors OFF, so as to reduce quiescent current to a minimum.

As will be appreciated from the foregoing description, the ability of a current mirror circuit to controllably drive large currents in a precision, regulated manner is achieved in accordance with the present invention without altering the size of the output transistor, by means of an auxiliary (by-pass) transistor that is effectively coupled in parallel with the current regulation transistor and the gate voltage of which is controlled by a (doped polysilicon) resistor voltage divider, the geometry and input voltage of which inherently compensate for the reduction in the size of the resistor in the main current control path.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A current control circuit comprising:
   an input terminal to which an input signal is applied;
   an output terminal from which an output signal is derived in response to the application of said input signal to said input terminal;
   a current mirror circuit coupled with said input and output terminals and first and second reference potential terminals, for controlling the flow of current at said output terminal, said current mirror circuit including an output transistor having an input electrode coupled to said output terminal, an output electrode coupled to one of said first and second reference potential terminals and a control electrode, and a current control transistor and a first resistor element coupled in circuit with the control electrode of said output transistor; and
   means, coupled to said current mirror circuit and said input terminal, for compensating for variations in parameters of said current mirror circuit and including means for controllably by-passing current that would otherwise flow through said control transistor during the flow of current through said current control transistor.

2. A current control circuit according to claim 1, wherein said compensating means comprises a bypass control transistor coupled to said current control transistor, and a voltage divider network, coupled between said first and second reference potential terminals and coupled to a control input of said bypass control transistor, for controlling the operation of said bypass control transistor in accordance the voltage differential between said first and second reference potential terminals.

3. A current control circuit according to claim 2, wherein said voltage divider network is comprised of a plurality of resistor elements the configuration of one of which corresponds to the configuration of said first resistor element.

4. A current control circuit according to claim 3, wherein each of said resistor elements is formed of a line of resistive material and wherein the width of said first and one resistor elements is the same.

5. A current control circuit according to claim 4, wherein the width of another of the resistor elements of said voltage divider network is larger than the widths of said first and one resistor elements.

6. A current control circuit according to claim 2, wherein said voltage divider network is comprised of second and third resistor elements, the resistance ratio of which remains effectively unchanged for variations in sheet resistance of the material of which said second and third resistor elements are formed.

7. A current control circuit according to claim 6, wherein the configuration of said second resistor element corresponds to the configuration of said first resistor element.

8. A current control circuit according to claim 7, wherein each of said resistor elements is formed of a line of semiconductive material and wherein the widths of said first and second resistor elements are the same.

9. A current control circuit according to claim 2, wherein said current control transistor and said bypass control transistors are comprises of field effect transistors having different channel lengths.

10. A digital CMOS current control circuit comprising:
    an input terminal to which a digital input signal is applied;
    an output terminal from which a digital output signal is derived in response to the application of a digital input signal to said input terminal;
    a first CMOS transistor coupled in circuit between said input terminal and said output terminal for controlling the generation of a digital output signal at said output terminal in accordance with said digital input signal;
    first means, coupled in circuit with the gate of said first CMOS transistor, for controlling the flow of current through said first CMOS transistor, said first means including a second CMOS transistor and a first resistor element coupled between first and second reference potential terminals, said first and second CMOS transistors forming a current mirror circuit; and
    second means, coupled to said current mirror circuit and said input terminal, for compensating for variations kin parameters of said current mirror circuit and including a third CMOS transistor, coupled in circuit with said second CMOS transistor and said second reference potential terminal, for controllably by-passing current that would otherwise flow through said second CMOS transistor during the flow of current through said second CMOS transistor.

11. A current control circuit according to claim 10, wherein said second means comprises a voltage divider network, coupled between said first and second reference potential terminals and coupled to a gate of said third CMOS transistor, for controlling the operation of said third CMOS transistor in accordance the voltage differential between said first and second reference potential terminals.

12. A current control circuit according to claim 11, wherein said first resistor element is formed of semiconductive material and wherein said voltage divider network is comprised of second and third resistor elements formed of semiconductive material, and wherein the configuration of said second resistor element corresponds to the configuration of said first resistor element.

13. A current control circuit according to claim 12, wherein the width of said third resistor element is larger than the widths of said first and second resistor elements.

14. A current control circuit according to claim 12, wherein the resistance ratio of said second and third resistor elements remains effectively unchanged for variations in sheet resistance of the material of which said second and third resistor elements are formed.

15. A current control circuit according to claim 11, wherein said second and third CMOS transistors have different channel lengths.

16. A current control circuit according to claim 11, wherein each of said first, second and third CMOS transistors has a first channel conductivity type and wherein said current mirror circuit further includes a fourth CMOS transistor of a second channel conductivity type, opposite to said first channel conductivity type, coupled in circuit with said first resistor element and said first reference potential terminal.

17. A current control circuit according to claim 16, further including a fifth CMOS transistor of said second channel conductivity type, having a gate coupled to said input terminal and its source-drain path coupled between said first reference potential terminal and said voltage divider network.

18. A current control circuit according to claim 17, wherein the gate of said fourth CMOS transistor is coupled to said input terminal.

19. A current control circuit according to claim 18, further including switch means, coupled in circuit between each of said voltage divider network, said second and third CMOS transistors and said second reference potential terminal and being responsive to the signal level at said output terminal, for controllably coupling and decoupling said voltage divider network and said second and third CMOS transistors with respect to said second reference potential terminal in accordance with the signal level at said output terminal.

20. A digital CMOS current control circuit comprising:
   an input terminal to which a digital input signal is applied;
   an output terminal from which a digital output signal is derived in response to the application of a digital input signal to said input terminal;
   a first CMOS transistor, of a first channel conductivity type, coupled in circuit between said input terminal and said output terminal, for controlling the generation of a digital output signal at said output terminal in accordance with said digital input signal;
   first means for controlling the flow of current through said first CMOS transistor, said first means including a second CMOS transistor, of a second channel conductivity type, opposite to said first channel conductivity type, a first resistor element, and a third CMOS transistor of said first channel conductivity type and having a channel width which is less than that of said first CMOS transistor, coupled in circuit between first and second reference potential terminals, and being coupled in circuit with the gate of said first CMOS transistor; and
   second means, coupled to said third CMOS transistor and to said input terminal, and including a fourth CMOS transistor of said first channel conductivity type, coupled in circuit with said third CMOS transistor and said second reference potential terminal, for controllably by-passing current that would otherwise flow through said third CMOS transistor during the flow of current through said third CMOS transistor.

21. A current control circuit according to claim 20, wherein said second means comprises a voltage divider network, coupled between said first and second reference potential terminals and coupled to the gate of said fourth CMOS transistor, for controlling the operation of said fourth CMOS transistor in accordance the voltage differential between said first and second reference potential terminals.

22. A current control circuit according to claim 21, wherein said first resistor element is formed of semiconductive material and wherein said voltage divider network is comprised of second and third resistor elements formed of semiconductive material, and wherein the configuration of said second resistor element corresponds to the configuration of said first resistor element.

23. A current control circuit according to claim 22, wherein the width of said third resistor element is larger than the widths of said first and second resistor elements and wherein the resistance ratio of said second and third resistor elements remains effectively unchanged for variations in sheet resistance of the material of which said second and third resistor elements are formed.

24. A current control circuit according to claim 22, wherein said third and fourth CMOS transistors have different channel lengths.

25. A current control circuit according to claim 22, further including a fifth CMOS transistor of said second channel conductivity type, having a gate coupled to said input terminal and its source-drain path coupled between said first reference potential terminal and said voltage divider network, and wherein the gate of said second CMOS transistor is coupled to said input terminal.

26. A current control circuit according to claim 25, further including switch means, coupled in circuit between each of said voltage divider network, said third and fourth CMOS transistors and said second reference potential terminal and being responsive to the signal level at said output terminal, for controllably coupling and decoupling said voltage divider network and said third and fourth CMOS transistors with respect to said second reference potential terminal in accordance with the signal level at said output terminal.

* * * * *